US008513775B2

United States Patent
Suzuki et al.

(10) Patent No.: US 8,513,775 B2
(45) Date of Patent: Aug. 20, 2013

(54) CDTE SEMICONDUCTOR SUBSTRATE FOR EPITAXIAL GROWTH AND SUBSTRATE CONTAINER

(75) Inventors: Kenji Suzuki, Kitaibaraki (JP); Hideyuki Taniguchi, Kitaibaraki (JP); Hideki Kurita, Kitaibaraki (JP); Ryuichi Hirano, Kitaibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 89 days.

(21) Appl. No.: 13/131,614

(22) PCT Filed: Sep. 30, 2010

(86) PCT No.: PCT/JP2010/067142
§ 371 (c)(1), (2), (4) Date: May 27, 2011

(87) PCT Pub. No.: WO2011/040566
PCT Pub. Date: Apr. 7, 2011

(65) Prior Publication Data
US 2011/0233729 A1    Sep. 29, 2011

(30) Foreign Application Priority Data
Sep. 30, 2009  (JP) ................................. 2009-227697

(51) Int. Cl.
*H01L 29/22*  (2006.01)
*H01L 31/0328*  (2006.01)
*H01L 31/0296*  (2006.01)
*H01L 31/00*  (2006.01)
*H01L 31/0336*  (2006.01)

(52) U.S. Cl.
USPC ............ 257/614; 257/188; 257/200; 257/442

(58) Field of Classification Search
USPC ................. 257/614, 188, 200, 442, 441, 191
See application file for complete search history.

(56) References Cited

U.S. PATENT DOCUMENTS
2010/0258173 A1*  10/2010  Laia et al. ...................... 136/256
2012/0073649 A1*  3/2012  Blue et al. ...................... 136/258

FOREIGN PATENT DOCUMENTS

| JP | 62-290135 A | 12/1987 |
|---|---|---|
| JP | 3-248425 A | 11/1991 |
| JP | 5-82459 A | 4/1993 |
| JP | 5-177536 A | 7/1993 |
| JP | 6-177100 A | 6/1994 |
| JP | 2002-329715 A | 11/2002 |
| WO | WO 2008/023639 A1 | 2/2008 |

OTHER PUBLICATIONS

International Search Report for PCT/JP2010/067142, mailed on Nov. 9, 2010.

* cited by examiner

*Primary Examiner* — Chuong A. Luu
(74) *Attorney, Agent, or Firm* — Birch, Stewart, Kolasch & Birch, LLP

(57) ABSTRACT

Provided is a CdTe-based semiconductor substrate for epitaxial growth, which is capable of growing good-quality epitaxial crystals without urging a substrate user to implement etching treatment before the epitaxial growth.

A CdTe-based semiconductor substrate, in which tracks of linear polishing damage with a depth of 1 nm or more are not observed within a viewing range of 10 μm×10 μm when a surface of the substrate is observed by an atomic force microscope, and orange peel defects are not observed when the surface of the substrate is visually observed under a fluorescent lamp, can grow the good-quality epitaxial crystals.

12 Claims, 4 Drawing Sheets

CDTE SEMICONDUCTOR SUBSTRATE FOR EPITAXIAL GROWTH AND SUBSTRATE CONTAINER

TECHNICAL FIELD

The present invention relates to a CdTe-based semiconductor substrate for epitaxial growth, which is used as a substrate material of an infrared detection element or the like, and to a substrate container that houses the CdTe-based semiconductor substrate for the epitaxial growth.

BACKGROUND ART

In general, in the case of manufacturing a semiconductor device by using a cadmium telluride (CdTe) substrate, CdTe single crystals grown by a vertical gradient freezing method (VGF method) and the like are processed into a flat plate with a desired size, and a surface of the flat plate is polished (subjected to mirror surface polishing), whereby a substrate material for manufacturing the device is prepared. On such a CdTe substrate, a predetermined semiconductor (for example, an HgZnTe film and the like) is epitaxially grown, and a semiconductor device such as an infrared detection element is manufactured.

Heretofore, it has been frequent that a user (substrate user) who has purchased the CdTe substrate performs such epitaxial growth after, as pretreatment, etching the CdTe substrate by approximately from several micrometers (μm) to ten micrometers in order to remove an oxidation film generated in a processing finishing step for a surface of the CdTe substrate and in a subsequent period of storing the substrate.

For example, in Patent Document 1, a general method of such polishing (mirror surface polishing) is disclosed, and in Patent Document 2, a general method of etching treatment is disclosed. Moreover, in Patent Document 3, a process is disclosed, in which a single crystal substrate of $Hg_{0.8}Cd_{0.2}Te$ is polished by a diamond polishing liquid with a particle diameter of 0.5 μm, and is thereafter etched by a 0.5% bromine-methanol solution for two minutes, whereby polishing scratches are removed.

PRIOR ART DOCUMENT

Patent Document

Patent Document 1: Japanese Patent Laid-Open Publication No. H05-177536
Patent Document 2: Japanese Patent Laid-Open Publication No. H06-177100
Patent Document 3: Japanese Patent Laid-Open Publication No. H03-248425

DISCLOSURE OF THE INVENTION

Problems to be Solved by the Invention

Incidentally, the surface oxidation that occurs while the substrate is being stored does not always progress uniformly, and such a tendency is observed that the surface oxidation progresses more rapidly and deeply along portions where tracks of thin linear polishing damage, which is extremely slight, are left. When the substrate is used for the epitaxial growth as it is, a decrease of epitaxial crystal quality is caused. The tracks of the linear polishing damage, which are mentioned here, stand for extremely thin and shallow groove streaks with a depth of approximately 0.1 nm and a width of approximately 0.5 nm, which are caused by a final polishing step and the subsequent etching treatment. The tracks concerned cannot be directly observed by an optical microscope, but can be observed by an atomic force microscope (AFM), a spin polarized scanning tunneling microscope (STM) and the like.

Heretofore, there have been considered to be no particular problems since, even if the linear polishing damage is caused in the final polishing step, both of the linear polishing damage (linear affected layer) and a surface oxidation film formed on the entire surface of the substrate are sufficiently removed by an etching step performed thereafter. However, though being eliminated from a portion of the affected layer, the linear polishing damage has remained as tracks having a shape of an extremely thin and shallow groove. An etching method suitable for removing the tracks has not been discovered yet.

Meanwhile, it has been frequent that the user who has purchased the substrate performs, as the pretreatment, the etching treatment for the substrate by approximately from several micrometers to ten micrometers immediately before use of the substrate, and preventively removes the oxidation film of the substrate surface, which is generated during a period from manufacture of the substrate to delivery thereof, and further, during a period from when the substrate is delivered to the user to when the substrate is unpacked and served for use. However, when the etching treatment as described above is implemented improperly, it has been frequently difficult to grow good-quality epitaxial crystals since orange peel defects occur on the surface of the CdTe substrate and planarity of the surface concerned is deteriorated.

It is an object of the present invention to provide a CdTe-based semiconductor substrate for the epitaxial growth, which is capable of growing the good-quality epitaxial crystals without letting such a substrate user implement the etching treatment before the epitaxial growth, and to provide a substrate container that houses the CdTe-based semiconductor substrate for the epitaxial growth.

Means For Solving The Problems

An invention according to claim 1 is one that has been made in order to achieve the foregoing object, and is a CdTe-based semiconductor substrate for epitaxial growth, wherein a track of a linear polishing damage with a depth of 1 nm or more is not observed within a viewing range of 10 μm×10 μm when a surface of the substrate is observed by an atomic force microscope, and an orange peel defect is not observed when the surface of the substrate is visually observed under a fluorescent lamp.

Here, the orange peel defects stand for wrinkle-like defects which occur on the surface of the substrate. Moreover, the CdTe-based semiconductor substrate stands for a semiconductor substrate that is made of CdZnTe or the like, which contains CdTe as a main component, and is added with a dopant such as Zn.

An invention according to claim 2 is the CdTe-based semiconductor substrate for epitaxial growth according to claim 1, wherein the surface of the substrate is subjected to predetermined polishing treatment, etching treatment responding to the polishing, and washing and drying treatment; wherein the substrate is subsequently stored for 24 hours to 36 hours in a clean booth of Class 100; wherein the substrate is subsequently subjected to light etching treatment with a light etching amount of 0.1 μm or more to 1 μm or less, and washing and drying treatment; wherein the substrate is subsequently stored for 6 hours to 36 hours in the clean booth of Class 100 one more time; and wherein the substrate is subsequently housed in a substrate container with a nitrogen gas atmosphere.

An invention according to claim 3 is the CdTe-based semiconductor substrate for epitaxial growth according to claim 2, wherein a deterioration in a thickness variation in the surface of the substrate due to the etching treatment is 0.4 μm or less.

Here, the thickness variation (TV) stands for a difference between a maximum value and minimum value of a thickness of each of five points in total, which are: one point on the center of the substrate; and four points at positions apart from four corners by 5 mm in the direction toward the center.

An invention according to claim 4 is a substrate container, which houses a substrate casing in a nitrogen gas atmosphere, the substrate casing housing the CdTe-based semiconductor substrate for epitaxial growth according to any one of claims 1 to 3.

In order to trace a cause of the quality decrease of the epitaxial crystals, which occurs when the epitaxial crystals are epitaxially grown on the CdTe substrate, the inventor of the present invention investigated in detail the surface of the CdTe substrate before the epitaxial growth. Then, as a result of continuing to observe the surface by using the AFM, the following were proven: tracks of fine polishing damage with a depth of approximately 1 nm came to be observed on the surface of the CdTe substrate in which 24 hours elapsed after mirror surface polishing; in the case where the epitaxial crystals were epitaxially grown on such a CdTe substrate as it was, it was frequent that the quality of the epitaxial crystals was decreased; and moreover, as a period of storing the substrate became longer, the quality of the epitaxial crystals also tended to be further decreased.

Moreover, when the CdTe substrate in which the predetermined time elapsed was subjected to the etching treatment after the mirror surface polishing, and the surface of the CdTe substrate after being subjected to the etching treatment was observed by the AFM, it was found out that, by performing etching with an extremely slight amount, the tracks of the fine linear polishing damage with a depth of approximately 1 nm faded, and came substantially not to be directly observable by the AFM observation. Moreover, it was found out that, when this etching amount exceeded 1 μm, the deterioration of the planarity and such roughing of the surface into the orange peel state became significant.

The present invention has been completed based on the findings described above, and defines the CdTe-based semiconductor substrate, which is suitable for the epitaxial growth, mainly by the existence or non-existence of the tracks of the linear polishing damage with a depth of not less than 1 nm, which are observed by the AFM, and by that of the orange peel defects visually observed under the fluorescent lamp.

Effect of the Invention

In accordance with the CdTe-based semiconductor substrate according to the present invention, the substrate user can grow the good-quality epitaxial crystals without implementing the etching treatment before the epitaxial growth. Moreover, the semiconductor device is manufactured by using the CdTe-based semiconductor substrate as described above, whereby enhancement of quality and yield of the semiconductor device can be achieved.

BEST MODE FOR CARRYING OUT THE INVENTION

Example 1

Figure 1:
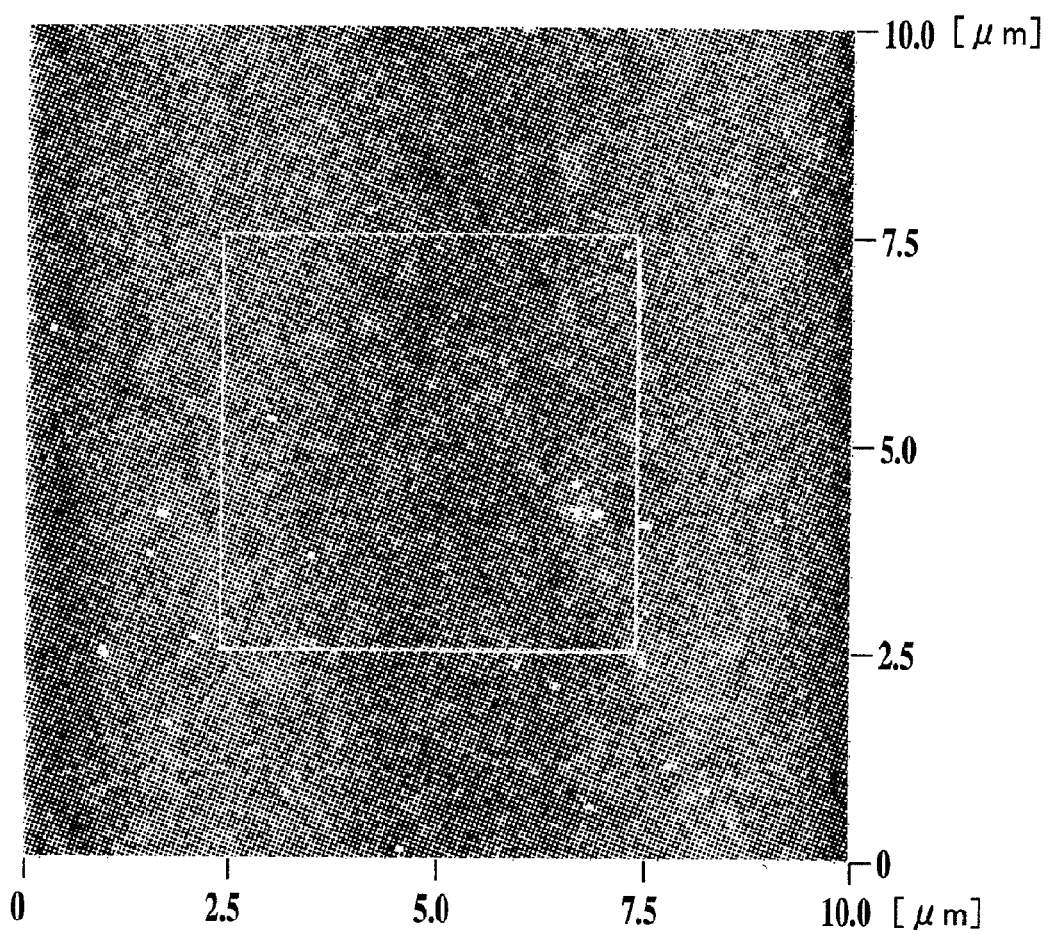
FIG. 1 This is an AFM image in Example 1 when a surface of a CdTe substrate after being stored in a substrate container for 24 hours is observed by an AFM.

In Example 1, five pieces of CdTe substrates 1 with a thickness of 1200 μm and a square of 30 mm×30 mm were cut out from a CdTe single crystal ingot grown, for example, by a VGF method, and were treated as a unit of processing per batch, and all processing steps to be described below were performed for the five pieces as a set. First, wrapping treatment was performed by using a polishing liquid in which an alumina abrasive grain with a particle diameter of 2 μm was dissolved into water and by using a glass polishing plate, and each of the CdTe substrates was processed so that the thickness thereof would become 552 μm. Next, by using a rotating polishing disk added with polishing cloth, polishing (minor surface polishing) treatment was performed according to the following conditions.

(Polishing Condition)

Mirror surface polishing liquid: mirror surface polishing liquid in which respective components were mixed in the following ratio aqueous calcium hypochlorite solution (effective chlorine: 70%): 1 L calcium hydrogencarbonate: 150 g water: 4 L calcium chloride: 60 g Diameter of surface plate of polishing machine: 300 mmφ

Number of revolutions of surface plate: 50 rpm

Processing pressure: 70 g/cm$^2$

Polishing Time: 70 min

Polishing flow rate: 2 L/hr

Polishing amount: 50 μm

Polishing cloth: foamed polyurethane-based soft cloth

Subsequently, in order to remove affected layers formed by the above-described polishing treatment, the CdTe substrates were immersed into a 0.3% bromine-methanol solution, and a surface of each of the substrates was etched by 2 μm (hereinafter, this is referred to as polishing-responding etching treatment). Then, the CdTe substrates were stored in a clean booth of Class 100 for 24 hours after being subjected to washing and drying treatment.

These mirror-surface CdTe substrates were immersed into a 0.1% bromine-methanol solution (etching solution) immediately after an appropriate amount of bromine was dropped into a methanol solution and was stirred, and the surfaces of the substrates were uniformly etched. At this time, an etching time was set at eight seconds so that an etching amount could become 0.3 μm (hereinafter, this is referred to as light etching treatment).

Note that an etching solution for use in the light etching treatment was set at room temperature (28° C.), however, it is desirable that the temperature is lower in order to control the etching amount more accurately. The temperature of the etching solution is set at 15° C. or lower, more preferably, 10° C. or lower, whereby such a light etching amount can be controlled more accurately.

After the light etching treatment, rinse treatment of immersing the substrates into a methanol bath was implemented twice, and the substrates were dried by blowing nitrogen ($N_2$) gas thereto, and were stored in the clean booth of Class 100 for 24 hours. Thereafter, the substrates were housed in substrate container with a nitrogen gas atmosphere (the five pieces of the CdTe substrates 1 were individually housed in single wafer-type substrate casings 2, thereafter, the five substrate casings 2 were put into one laminate bag 3, followed by nitrogen gas substitution, and thereafter, the bag 3 was hermetically sealed).

Then, at the point of time when 24 hours elapsed, the laminate bag was opened, two pieces of the CdTe substrates were taken out therefrom, and immediately, HgZnTe films were epitaxially grown on the CdTe substrates. Moreover, with regard to the other three pieces of the CdTe substrates housed in the laminate bag together with these two pieces, surface observation by an AFM and visual surface observation under a fluorescent lamp were performed therefor.

FIG. 1 is an example of an AFM image in Example 1 when the surface of the CdTe substrate after being stored in the substrate container for 24 hours was observed in a viewing range of 10 μm×10 μm by the AFM. Note that, in FIG. 1, a viewing range of 5 μm×5 μm is shown by an inner white line frame.

As shown in FIG. 1, on the surface of the CdTe substrate obtained in Example 1, tracks of linear polishing damage with a depth of approximately 1 nm were not observed. Moreover, as a result of visually observing the surface of the CdTe substrate under the fluorescent lamp, orange peel defects were not observed, either. Furthermore, a deterioration regarding a thickness variation in the surface of the substrate owing to the light etching treatment became 0.4 μm. The HgZnTe film epitaxially grown on this CdTe substrate had good-quality crystallinity, and was preferable for manufacturing a semiconductor device.

In Example 1, with regard to each of the CdTe substrates when 60 days elapsed after being housed in the substrate container, the surface observation by the AFM, the visual surface observation under the fluorescent lamp, and the crystallinity of the epitaxially grown HgZnTe film were inspected. As a result, in comparison with the case of storing the CdTe substrate in the substrate container for 24 hours, a significant difference was not seen on a surface state of the CdTe substrate, and crystallinity of epitaxial crystals thus obtained was also good.

Example 2

In Example 2, five pieces of the CdTe substrates were cut out and subjected to the treatment up to the polishing treatment in a similar way to Example 1, were subsequently subjected to the polishing-responding etching treatment and the washing and drying treatment, and were stored in the clean booth of Class 100 for 36 hours. These CdTe substrates were subjected to the light etching treatment, the rinse treatment and the drying treatment in a similar way to Example 1, were stored in the clean booth of Class 100 for 24 hours, and were thereafter housed in the substrate container with the nitrogen gas atmosphere (the five pieces of the CdTe substrates were individually housed in the single wafer-type substrate casings, thereafter, the five substrate casings were put into one laminate bag, followed by the nitrogen gas substitution, and thereafter, the bag was hermetically sealed).

Then, at the point of time when 24 hours elapsed, the laminate bag was opened, two pieces of the CdTe substrates were taken out therefrom, and immediately, HgZnTe films were epitaxially grown on the CdTe substrates. Moreover, with regard to the other three pieces of the CdTe substrates housed in the laminate bag together with these two pieces, the surface observation by the AFM and the visual surface observation under the fluorescent lamp were performed therefor.

As a result, in comparison with Example 1, a significant difference was not particularly seen on a surface state of each of the CdTe substrates, and crystallinity of epitaxial crystals thus obtained was also good. Moreover, in Example 2, also in the case where each of the CdTe substrates was stored in the substrate container for 60 days, similar results were obtained.

Comparative Example 1

In Comparative example 1, five pieces of the CdTe substrates were cut out and subjected to the treatment up to the polishing treatment in a similar way to Example 1, were subsequently subjected to the polishing-responding etching treatment and the washing and drying treatment, were stored in the clean booth of Class 100 for 24 hours, and thereafter, were housed in the substrate container with the nitrogen gas atmosphere (the five pieces of the CdTe substrates were individually housed in the single wafer-type substrate casings, thereafter, the five substrate casings were put into one laminate bag, followed by the nitrogen gas substitution, and thereafter, the bag was hermetically sealed).

Then, at the point of time when 24 hours elapsed, the laminate bag was opened, two pieces of the CdTe substrates were taken out therefrom, and immediately, HgZnTe films were epitaxially grown on the CdTe substrates. Moreover, with regard to the other three pieces of the CdTe substrates housed in the laminate bag together with these two pieces, the surface observation by the AFM and the visual surface observation under the fluorescent lamp were performed therefor.

Figure 2:
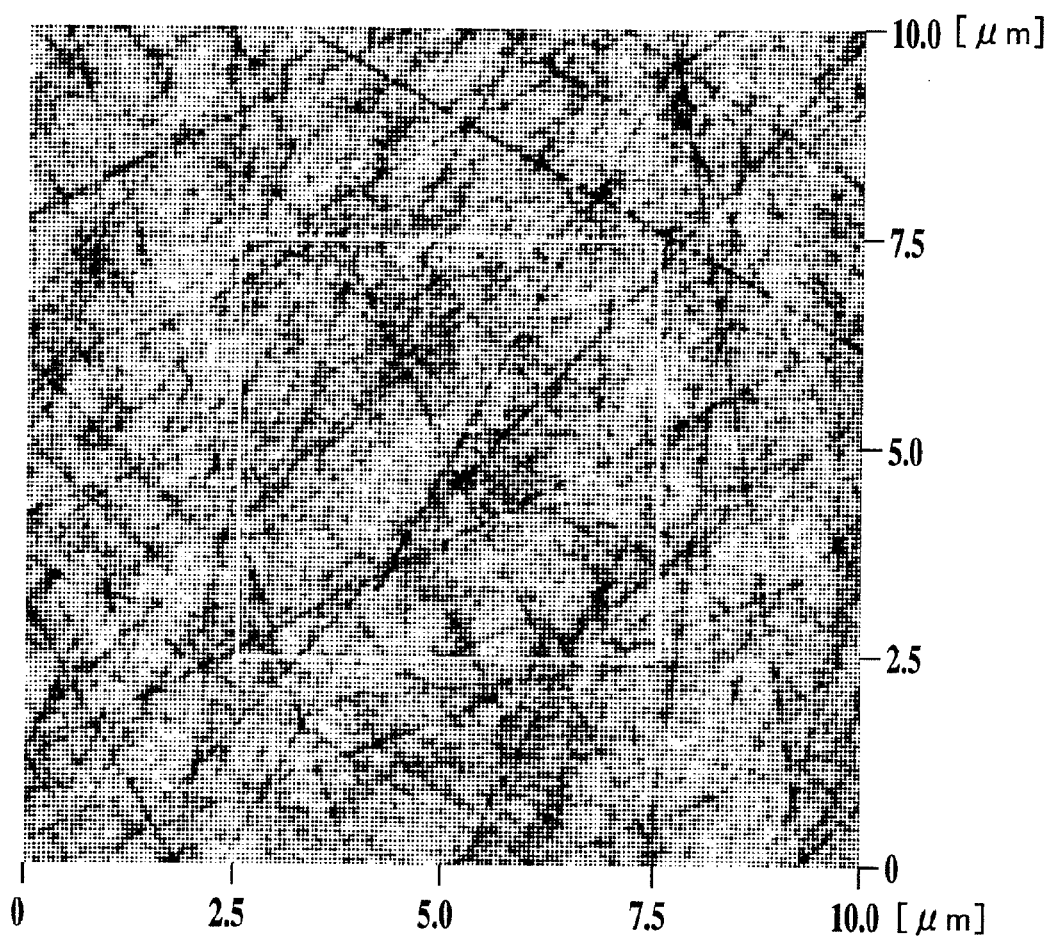
FIG. 2 This is an AFM image in Comparative example 1 when a surface of a CdTe substrate after being stored in the substrate container for 24 hours is observed by the AFM.
Figure 3:
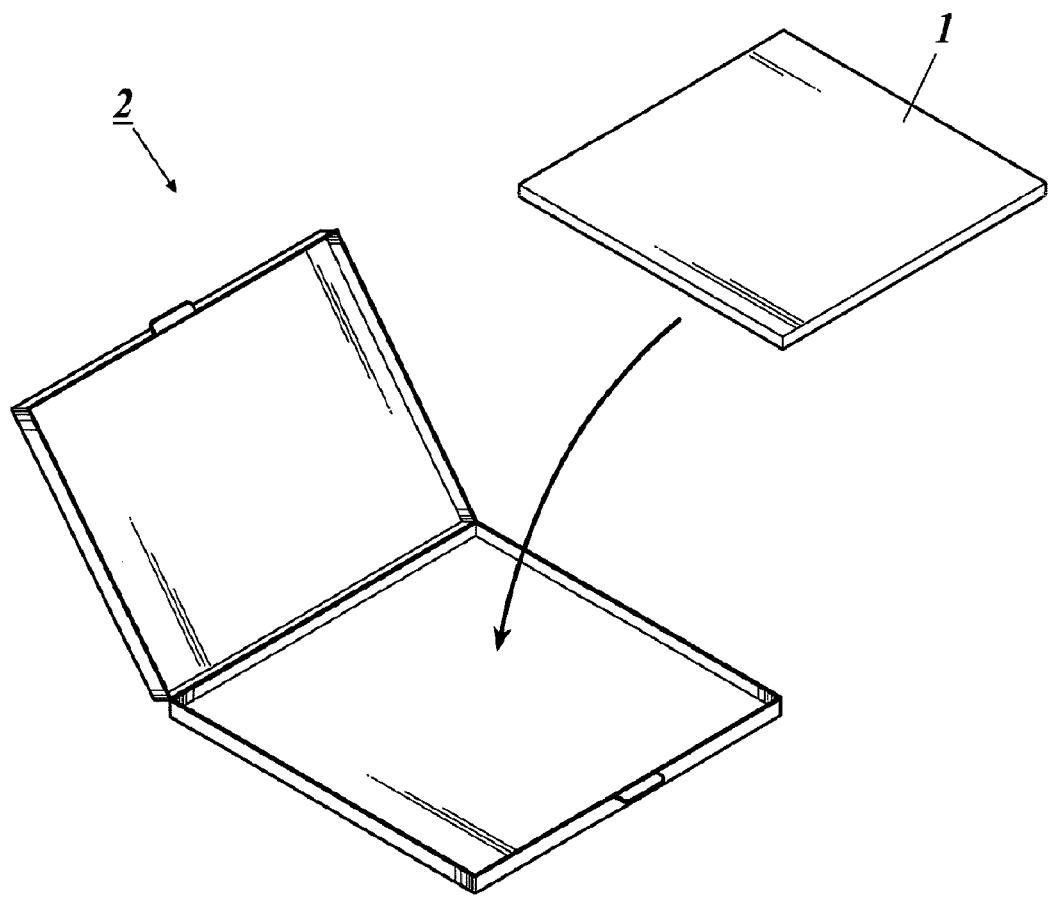
FIG. 3 This is a view showing a single wafer-type substrate casing 2 which houses the CdTe semiconductor substrate 1 therein.
Figure 4A:
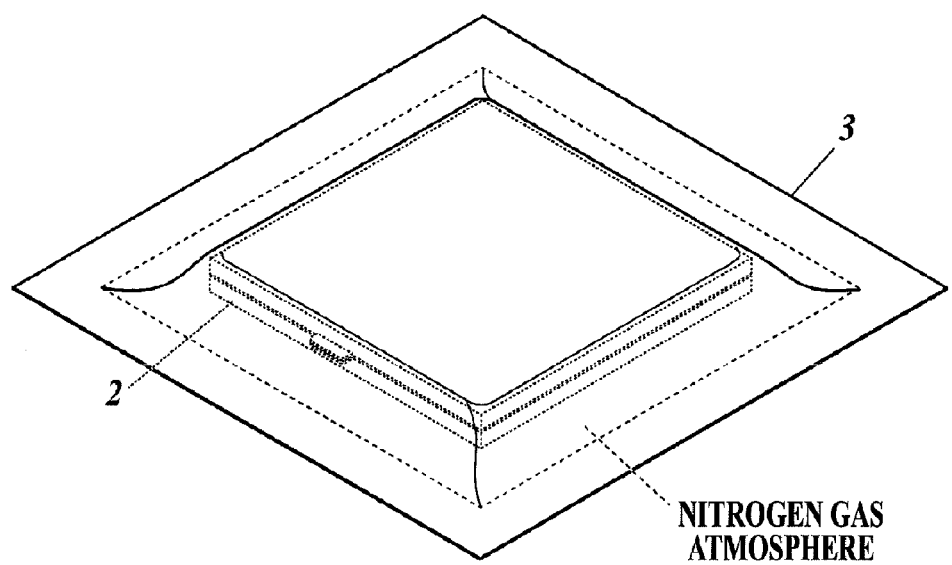
FIG. 4A This is a view showing a substrate container (a laminate bag 3) which contains one substrate casing 2 housing the substrate 1, in a nitrogen gas atmosphere.
Figure 4B:
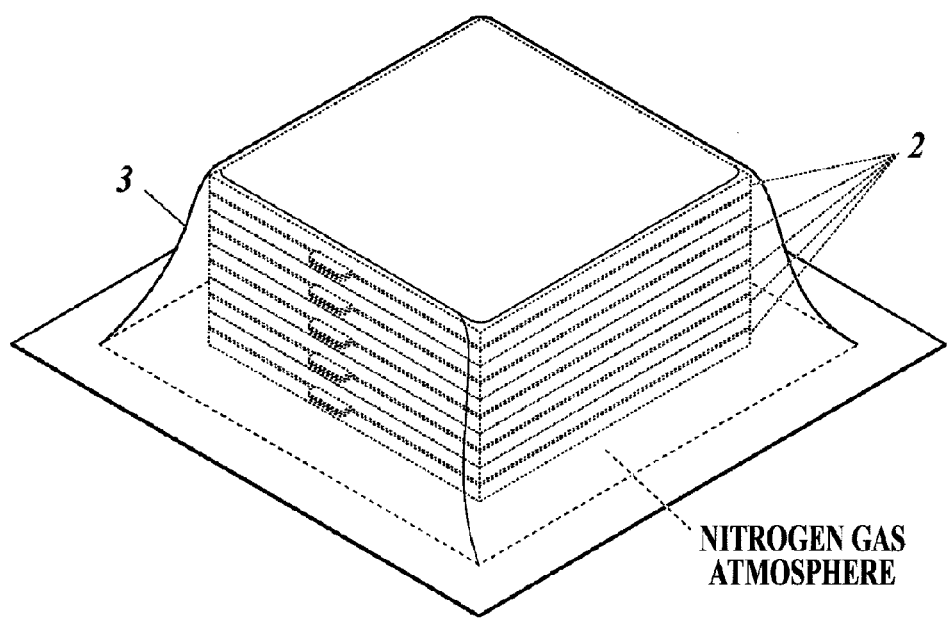
FIG. 4B This is a view showing a substrate container (a laminate bag 3) which contains five substrate casings 2 each housing the substrate 1, in a nitrogen gas atmosphere.

FIG. 2 is an example of an AFM image in Comparative example 1 when the surface of the CdTe substrate after being stored in the substrate container for 24 hours was observed in a viewing range of 10 μm×10 μm by the AFM. Note that, in FIG. 2, a viewing range of 5 μm×5 μm is shown by an inner white line frame.

As shown in FIG. 2, on the surface of each of the CdTe substrates obtained in Comparative example 1, a large number of tracks of linear polishing damage with a depth of approximately 1 nm were observed over the entire surface of the substrate concerned. Moreover, in the visual surface observation under the fluorescent lamp, the orange peel defects were not observed on the surface of the CdTe substrate. Crystallinity of the HgZnTe film epitaxially grown on this CdTe substrate was decreased in comparison with Examples 1 and 2. Furthermore, in Comparative example 1, also in the case where each of the CdTe substrates was stored in the substrate container for 60 days, similar results were obtained.

In Comparative example 1, the light etching treatment was not implemented for the CdTe substrate after the washing and drying treatment. Accordingly, the tracks of the linear polishing damage became thick and deep owing to surface oxidation during the storage of the CdTe substrate in the clean booth, which was performed after the polishing-responding etching treatment and the washing and drying treatment, resulting in that a large number of the tracks concerned remained, or alternatively, the oxidation progressed deeply from portions of the tracks of the polishing damage toward the inside of the substrate, and it is considered that the crystallinity of the epitaxial crystals was therefore decreased.

Comparative Example 2

In Comparative example 2, five pieces of the CdTe substrates were cut out and subjected to the treatment up to the polishing treatment in a similar way to Examples, were subsequently subjected to the polishing-responding etching treatment and the washing and drying treatment, and were stored in the clean booth of Class 100 for 24 hours. Then, these mirror-surface CdTe substrates were immersed into a 0.1% bromine-methanol solution (etching solution) in a stirred state after an appropriate amount of bromine was dropped into a methanol solution, and surfaces of the substrates were uniformly etched. At this time, the etching time was set at as long as 80 seconds so that the etching amount could become 3 μm (hereinafter, this is referred to as deep etching treatment).

After being subjected to the deep etching treatment, the CdTe substrates were subjected to the rinse treatment and the drying treatment in a similar way to Example 1, were stored in the clean booth of Class 100 for 24 hours, and were thereafter housed in the substrate container with the nitrogen gas atmosphere (the five pieces of the CdTe substrates were individually housed in the single wafer-type substrate casings, thereafter, the five substrate casings were put into one laminate bag, followed by the nitrogen gas substitution, and thereafter, the bag was hermetically sealed).

Then, at the point of time when 24 hours elapsed, the laminate bag was opened, two pieces of the CdTe substrates were taken out therefrom, and immediately, HgZnTe films were epitaxially grown on the CdTe substrates. Moreover, with regard to the other three pieces of the CdTe substrates housed in the laminate bag together with these two pieces, the surface observation by the AFM and the visual surface observation under the fluorescent lamp were performed therefor.

As a result, though the tracks of the linear polishing damage with a depth of approximately 1 nm were not observed on the surface of each of the CdTe substrates, the orange peel defects were observed in the visual observation under the fluorescent lamp. Moreover, a deterioration regarding a thickness variation in the surface of the substrate owing to the deep etching reached 5 μm to the maximum, and planarity of the surface was seriously decreased in comparison with Examples 1 and 2. Crystallinity of the HgZnTe film epitaxially grown on this CdTe substrate was decreased in comparison with Examples 1 and 2. Furthermore, in Comparative example 2, also in the case where each of the CdTe substrates was stored in the substrate container for 60 days, similar results were obtained.

In Comparative example 2, the etching treatment was implemented for the CdTe substrate after the polishing-responding etching treatment and the washing and drying treatment, however, the etching treatment was the deep etching treatment in which the etching amount was larger in comparison with those of Examples 1 and 2, the planarity of the surface was thereby decreased, and the orange peel defects also occurred, and it is considered that the crystallinity of the epitaxial crystals was therefore decreased. Moreover, as an inspection result obtained by repeating such an experiment, the following were confirmed: it became frequent that the deterioration regarding the thickness variation in the surface of the substrate owing to the etching treatment after the washing and drying treatment exceeded 1 μm when the etching amount became larger than 1 μm; and when the deterioration became larger than 0.4 μm, the crystallinity of the epitaxial crystals started to be gradually and partially decreased mainly from an outer circumferential portion of the substrate and from a periphery thereof.

Comparative Example 3

In Comparative example 3, five pieces of the CdTe substrates were cut out and subjected to the treatment up to the polishing treatment in a similar way to Example 1, were subsequently subjected to the polishing-responding etching treatment and the washing and drying treatment, and were stored in the clean booth of Class 100 for seven days. These CdTe substrates were subjected to light etching treatment, rinse treatment and drying treatment, which were similar to those of Example 1, were stored in the clean booth of Class 100 for 24 hours, and were thereafter housed in the substrate container with the nitrogen gas atmosphere (the five pieces of the CdTe substrates were individually housed in the single wafer-type substrate casings, thereafter, the five substrate casings were put into one laminate bag, followed by the nitrogen gas substitution, and thereafter, the bag was hermetically sealed).

Then, at the point of time when 24 hours elapsed, the laminate bag was opened, two pieces of the CdTe substrates were taken out therefrom, and immediately, HgZnTe films were epitaxially grown on the CdTe substrates. Moreover, with regard to the other three pieces of the CdTe substrates housed in the laminate bag together with these two pieces, the surface observation by the AFM and the visual surface observation under the fluorescent lamp were performed therefor.

As a result, on the surface of each of the CdTe substrates, the tracks of the linear polishing damage with a depth of approximately 1 nm were observed over the entire surface of the substrate concerned at a frequency that is approximately a half of that of Comparative example 1, however, the orange peel defects were not observed in the visual observation under the fluorescent lamp. Though not so much as in Comparative example 1, crystallinity of the HgZnTe film epitaxially grown on this CdTe substrate was obviously decreased in comparison with those of Examples 1 and 2. Moreover, in Comparative example 3, also in the case where each of the CdTe substrates was stored in the substrate container for 60 days, similar results were obtained.

In Comparative example 3, such a standing time (period of storing the CdTe substrate in the clean booth) after the polishing-responding etching treatment and the washing and drying treatment was seven days, which was too long. Accordingly, surface oxidation of the portions of the tracks of the polishing damage progressed more deeply than in the other portions, and by the subsequent light etching treatment, etching of such a surface oxidation layer of the portions of the tracks of the polishing damage progressed more selectively and rapidly than in the other portions. As a result, the tracks of the linear polishing damage were left more deeply, thickly and widely, or alternatively, the oxidation progressed extremely thinly and deeply from the portions of the tracks of the polishing damage toward the direction of the inside of the substrate, a part of the surface oxidation layer remained without being completely removed by the light etching treatment, and it is considered that the crystallinity of the epitaxial crystals was therefore decreased.

Note that, when the period of storing the CdTe substrate in the clean booth after the polishing-responding etching treatment and the washing and drying treatment was set at three days or more, it was confirmed that similar results to those in Comparative example 3 were brought.

Comparative Example 4

In Comparative example 4, five pieces of the CdTe substrates were cut out and subjected to the treatment up to the polishing treatment in a similar way to Example 1, were subsequently subjected to the polishing-responding etching treatment and the washing and drying treatment, and immediately after the washing and drying treatment, were subjected to light etching treatment, rinse treatment and drying treatment, which were similar to those of Example 1. These CdTe substrates were stored in the clean booth of Class 100 for 24 hours, and thereafter, were housed in the substrate container with the nitrogen gas atmosphere (the five pieces of the CdTe substrates were individually housed in the single wafer-type substrate casings, thereafter, the five substrate casings were put into one laminate bag, followed by the nitrogen gas substitution, and thereafter, the bag was hermetically sealed).

Then, at the point of time when 24 hours elapsed, the laminate bag was opened, two pieces of the CdTe substrates were taken out therefrom, and immediately, HgZnTe films were epitaxially grown on the CdTe substrates. Moreover, with regard to the other three pieces of the CdTe substrates housed in the laminate bag together with these two pieces, the surface observation by the AFM and the visual surface observation under the fluorescent lamp were performed therefor.

As a result, on the surface of each of the CdTe substrates, a large number of the tracks of the linear polishing damage with a depth of approximately 1 nm were observed over the entire surface of the substrate concerned, however, in the visual surface observation under the fluorescent lamp, the orange peel defects were not observed thereon, and the same tendency as in Comparative example 1 was shown. Though not so much as in Comparative example 1, crystallinity of the HgZnTe film epitaxially grown on this CdTe substrate was obviously decreased in comparison with those of Examples 1 and 2. Moreover, in Comparative example 4, in the case where each of the CdTe substrates was stored in the substrate container for 60 days, such a deterioration tendency of the surface state of the CdTe substrate and the crystallinity of the epitaxial crystals was strengthened more.

In Comparative example 4, there was no standing time (period of storing the CdTe substrate in the clean booth) after the polishing-responding etching treatment and the washing and drying treatment, and the light etching was performed before a stable oxidation film was formed on such a substrate surface. In other words, Comparative example 4 was substantially the same as repeating the light etching in a short time immediately after performing the polishing-responding etching treatment to be performed before the washing and drying treatment, and the light etching progressed uniformly on the surface of the CdTe substrate that did not have the surface oxidation film. Accordingly, the effect of the light etching treatment hardly appeared, and irregularities of the surface of the substrate were left as they were and unchanged even after the light etching treatment. As a result, in a similar way to Comparative example 1, the tracks of the linear polishing damage became thick and deep owing to the surface oxidation during the storage of the CdTe substrate in the clean booth, which was performed after the polishing-responding etching treatment and the washing and drying treatment, resulting in that a large number of the tracks concerned remained, or alternatively, the oxidation progressed deeply from the portions of the tracks of the polishing damage toward the direction of the inside of the substrate, and it is considered that the crystallinity of the epitaxial crystals was therefore decreased.

As shown in Comparative examples 3 and 4, unless the period of storing the CdTe substrate in the clean room after the polishing-responding etching treatment and the washing and drying treatment is appropriate, the tracks of the polishing damage are not removed as intended even if the light etching treatment is implemented after the washing and drying treatment. In other words, in Examples 1 and 2, the CdTe substrate was stored for an appropriate time in the clean room after the washing and drying treatment, and accordingly, a stable oxidation film layer with substantially the same thickness that was extremely thin was formed over the entire surface of the substrate concerned, and only this oxidation film layer was uniformly removed by the short-time light etching. It is considered that, as a result, a major part of the portions of the tracks of the linear polishing damage was wrapped by the oxidation film layer and was removed together therewith, and remaining portions of the tracks became wider and shallower.

Comparative Example 5

In Comparative example 5, 15 pieces of the CdTe substrates were cut out and subjected to the treatment up to the polishing treatment in a similar way to Example 1, were subsequently subjected to the polishing-responding etching treatment and the washing and drying treatment, and were stored in the clean booth of Class 100 for 24 hours. Then, these CdTe substrates were subjected to light etching treatment, rinse treatment and drying treatment, which were similar to those of Example 1, and immediately, were housed in the substrate container with the nitrogen atmosphere (the five pieces of the CdTe substrates were individually housed in the single wafer-type substrate casings, thereafter, the five substrate casings were put into one laminate bag, followed by the nitrogen gas substitution, and thereafter, the bag was hermetically sealed). Three units of such containers which housed these CdTe substrates were simultaneously prepared.

Then, at each of the points of time when 24 hours, 30 days and 60 days elapsed, the laminate bag as one container was opened, and two pieces of the CdTe substrates were taken out therefrom, and immediately after the laminate bag was opened, HgZnTe films were epitaxially grown on the CdTe substrates. Moreover, with regard to the other three pieces of the CdTe substrates housed in the laminate bag together with these two pieces, the surface observation by the AFM and the visual surface observation under the fluorescent lamp were performed therefor.

As a result, with regard to the CdTe substrates in which 24 hours elapsed after the CdTe substrates concerned were housed in the substrate container, a significant difference from Examples 1 and 2 was not seen. Meanwhile, with regard to the CdTe substrates in which 30 days elapsed after the CdTe substrates concerned were housed in the substrate container, substrates came to be sporadically found, in which the tracks of the linear polishing damage with a depth of approximately 1 nm partially appeared on the surfaces, and with regard to the CdTe substrates in which 60 days elapsed after the CdTe substrates concerned were housed in the substrate container, it was observed that, on roughly all of the substrates, the tracks of the linear polishing damage with a depth of approximately 1 nm that was substantially the same as in Comparative example 3 (the substrates in which 24 hours elapsed after the substrates concerned were housed in the substrate container) partially appeared in some form. Note that, in any of the cases, the orange peel defects were not observed in the visual observation under the fluorescent lamp.

Crystallinity of HgZnTe films epitaxially grown on these CdTe substrates also showed the same tendency, and though there were many portions in which the crystallinity was good as a whole, spots where the crystallinity was not good were partially dotted, and a parti-colored pattern appeared. It was confirmed that, as the period of storing the CdTe substrates in the substrate container became longer, a decrease of the crystallinity of the epitaxial crystals progressed, and an area of the parti-colored pattern was increased.

In Comparative example 5, the CdTe substrates were housed in the substrate container immediately after the light etching treatment, the rinse treatment and the drying treatment (that is, were housed in a so-called half-dry state). Accordingly, the surface of each of the CdTe substrates was charged with static electricity, and the CdTe substrate was hermetically sealed and stored in the substrate container in an unstable state where surface activity was high (that is, reactivity was high) (in usual, the CdTe substrate is left in the clean booth for a fixed period after the drying treatment, and a wafer is exposed to an appropriate airflow, whereby such a problem is solved). Then, by the charging and surface activity of the substrate surface, the surface oxidation was accelerated during the storage of the CdTe substrate in the substrate container, and it is considered that the surface oxidation of the remaining portions of the tracks of the polishing damage therefore partially progressed, resulting in a partial decrease of the crystallinity of the epitaxial crystals.

As a result of an examination, the following were proven: as the standing time of the CdTe substrate in the clean booth after the light etching treatment, at least six hours were necessary in order to eliminate such a malfunction as in Comparative example 5, and in a time period from 12 hours to 24 hours, a particularly stable result was obtained with good reproducibility; and on the contrary, when the standing time exceeded 36 hours, a harmful effect caused by that the surface oxidation layer was thickened (that is, the entire decrease of the crystallinity of the epitaxial crystals) became conspicuous in turn.

As shown in Examples 1 and 2, in accordance with the CdTe substrate, in which the tracks of the linear polishing damage with a depth of 1 nm or more are not observed within the viewing range of 10 μm×10 μm when the substrate surface is observed by the atomic force microscope, and the orange peel defects are not observed when the substrate surface is visually observed under the fluorescent lamp, good-quality epitaxial crystals can be grown without implementing the etching treatment before the epitaxial growth. Moreover, the semiconductor device is manufactured by using the CdTe substrate as described above, whereby enhancement of quality and yield of the semiconductor device can be achieved.

The CdTe substrate as described above can be easily manufactured in such a manner that the substrate surface is subjected to the polishing treatment, the polishing-responding etching treatment and the washing and drying treatment, then the substrate is left in the clean booth of Class 100 for the predetermined time, and the substrate surface concerned is thereafter subjected to the light etching treatment. It is preferable to set the light etching amount within a range from 0.1 μm or more to 1 μm or less, and moreover, it is desirable that the deterioration regarding the thickness variation in the surface of the substrate after the light etching treatment is 0.4 μm or less.

The description has been specifically made above of the invention, which has been made by the inventor thereof, based on the embodiment. However, the present invention is not limited to the above-described embodiment, and is modifiable within the scope without departing from the spirit thereof.

For example, as the etching solution for use in the light etching treatment, usable is an etching liquid prepared by adding water (ultra pure water), hydrogen peroxide water, phosphoric acid, ethylene glycol or the like to the bromine-methanol solution, or by appropriately recombining the same. Moreover, for the substrate, crystals of CdZnTe or the like are applicable, which contain CdTe as a main component and are added with a dopant such as Zn.

It should be considered that the embodiment disclosed this time is made for the illustrative purpose and is not made for the purpose of limiting the invention in every point. The scope of the present invention is shown not by the above description but by the scope of claims, and it is intended that all modifications within the meaning and the scope, which are equivalent to the scope of claims, are incorporated.

The invention claimed is:

1. A CdTe-based semiconductor substrate for epitaxial growth, wherein a track of a linear polishing damage with a depth of 1 nm or more is not observed within a viewing range of 10 μm×10 μm when a surface of the substrate is observed by an atomic force microscope, and an orange peel defect is not observed when the surface of the substrate is visually observed under a fluorescent lamp.

2. The CdTe-based semiconductor substrate for epitaxial growth according to claim 1,
wherein the surface of the substrate is subjected to predetermined polishing treatment, etching treatment responding to the polishing, and washing and drying treatment;
wherein the substrate is subsequently stored for 24 hours to 36 hours in a clean booth of Class 100;
wherein the substrate is subsequently subjected to light etching treatment with a light etching amount of 0.1 μm or more to 1 μm or less, and washing and drying treatment;
wherein the substrate is subsequently stored for 6 hours to 36 hours in the clean booth of Class 100 one more time; and
wherein the substrate is subsequently housed in a substrate container with a nitrogen gas atmosphere.

3. The CdTe-based semiconductor substrate for epitaxial growth according to claim 2, wherein a deterioration in a thickness variation in the surface of the substrate due to the etching treatment is 0.4 μm or less.

4. A substrate container, which houses a substrate casing in a nitrogen gas atmosphere, the substrate casing housing the CdTe-based semiconductor substrate for epitaxial growth according to claim 1.

5. A CdTe-based semiconductor substrate for epitaxial growth, wherein at least one viewing range of 10 μm×10 μm, in which a track of a linear polishing damage with a depth of 1 nm or more is not observed, exists on a surface of the substrate observed by an atomic force microscope, and an orange peel defect is not observed when the surface of the substrate is visually observed under a fluorescent lamp.

6. The CdTe-based semiconductor substrate for epitaxial growth according to claim 5,
wherein the surface of the substrate is subjected to a predetermined polishing treatment, a first etching treatment responding to the polishing, and washing and drying treatment;
wherein the substrate is subsequently stored for a first predetermined time in a clean booth;

wherein the substrate is subsequently subjected to a second etching treatment, and washing and drying treatment; and wherein the substrate is subsequently stored for a second predetermined time in the clean booth.

7. The CdTe-based semiconductor substrate for epitaxial growth according to claim 6, wherein a deterioration in a thickness variation in the surface of the substrate due to the first etching treatment is 0.4 μm or less.

8. The CdTe-based semiconductor substrate for epitaxial growth according to claim 6, wherein the second etching treatment is a light etching amount of 0.1 μm or more to 1 μm or less.

9. The CdTe-based semiconductor substrate for epitaxial growth according to claim 6, wherein the first predetermined time is 24 hours to 36 hours.

10. The CdTe-based semiconductor substrate for epitaxial growth according to claim 6, wherein the second predetermined time is 6 hours to 36 hours.

11. The CdTe-based semiconductor substrate for epitaxial growth according to claim 6, wherein the substrate is housed in a substrate container with a nitrogen gas atmosphere after the storing for the second predetermined time in the clean booth.

12. A substrate container, which houses a substrate casing in a nitrogen gas atmosphere, the substrate casing housing the CdTe-based semiconductor substrate for epitaxial growth according to claim 5.

* * * * *